(12) United States Patent
Schuster et al.

(10) Patent No.: US 7,927,442 B2
(45) Date of Patent: Apr. 19, 2011

(54) METHOD AND APPARATUS FOR PRODUCING AN INSULATION SUPPORT WITH AN ADHESIVE LAYER FOR A MAGNETIC RESONANCE GRADIENT COIL

(75) Inventors: Johann Schuster, Oberasbach (DE); Lothar Schoen, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 804 days.

(21) Appl. No.: 11/770,871

(22) Filed: Jun. 29, 2007

(65) Prior Publication Data

US 2008/0121337 A1   May 29, 2008

(30) Foreign Application Priority Data

Jun. 29, 2006   (DE) .......................... 10 2006 029 959

(51) Int. Cl.
  *B32B 37/00* (2006.01)
(52) U.S. Cl. ........................................ 156/87; 156/250
(58) Field of Classification Search .................... 156/87, 156/60, 250
See application file for complete search history.

(56) References Cited

U.S. PATENT DOCUMENTS

| 3,723,223 | A | * | 3/1973 | Le Compte | 156/313 |
| 5,349,744 | A | * | 9/1994 | Takahashi | 29/602.1 |
| 5,409,558 | A | * | 4/1995 | Takahasi et al. | 156/172 |
| 6,311,389 | B1 | * | 11/2001 | Uosaki et al. | 29/605 |
| 2004/0140806 | A1 | | 7/2004 | Schuster et al. | |
| 2004/0224129 | A1 | * | 11/2004 | Sakurai et al. | 428/156 |
| 2007/0224416 | A1 | * | 9/2007 | Matsubayashi et al. | 428/343 |

FOREIGN PATENT DOCUMENTS

| DE | 2 225 165 | | 1/1974 |
| DE | 2553975 | A1 * | 7/1976 |
| DE | 42 32 882 | | 3/1994 |
| DE | 103 15 539 | | 10/2004 |
| EP | 1 623 827 | | 2/2006 |
| GB | 1157621 | | 7/1969 |
| WO | WO-2005/116157 | A1 * | 12/2005 |

* cited by examiner

*Primary Examiner* — Jeff H Aftergut
(74) *Attorney, Agent, or Firm* — Schiff Hardin LLP

(57) ABSTRACT

In a method and apparatus for producing a plate-type insulation support provided with an adhesive layer for a gradient coil for a magnetic resonance device, an adhesive film forming the adhesive layer is used, which has a number of openings distributed over its surface to allow the passage of air and which is applied to the insulation support.

20 Claims, 2 Drawing Sheets

METHOD AND APPARATUS FOR PRODUCING AN INSULATION SUPPORT WITH AN ADHESIVE LAYER FOR A MAGNETIC RESONANCE GRADIENT COIL

BACKGROUND OF THE INVENTION

1. Field of the Invention

The present invention relates to a method and an apparatus for producing a sheet-like (i.e. plate-type or panel-like) insulation support provided with an adhesive layer for a gradient coil of a magnetic resonance device.

2. Description of the Prior Art

Gradient coils for magnetic resonance devices have a number of layers of individual copper coils (windings) that generate gradient fields, with insulating layers and cooling systems therebetween. The insulating layers are formed by a plate-type insulation support. To produce such a gradient coil, the copper coils are first wound in a horizontal form defining the winding geometry. This form has defined grooves, in which the copper conductors are laid to form the coil. The wound conductors project somewhat from the plane of the form, allowing an insulation support to be positioned thereupon and to be attached to the wound coils. The coil windings are fixed by this attachment to the insulation support and can then be removed from the winding form and be bent together with the insulation support attached thereto into a curved shape to form a cylindrical gradient coil.

The insulation support has an adhesive layer that attaches the insulation support to the copper windings. This adhesive layer conventionally is applied to the plate-type insulation support as a reactive, adhesive containing solvent, with the solvent then being evaporated. Defined curing causes the adhesive to change to what is known as the B state, in other words it is partially hardened in place. If the insulation support is now to be attached to the coil windings, the support with the adhesive layer is positioned on the windings and heated, with the result that the adhesive changes to a sticky (tacky) state, after which it finally hardens.

The production and handling of such insulation supports is time-consuming and complex. In particular the fact that the adhesive layer has changed to an already pre-reacted B state permits only a relatively narrow processing time window, during which sufficient adhesion of the adhesive is ensured and therefore a reliable connection to the coil windings is possible. Application of the adhesive is also complex; in particular it is necessary to ensure a uniform layer thickness and it is also essential to prevent air bubbles in the adhesive and toward the insulation support, to ensure the required partial discharge resistance over this coil section.

SUMMARY OF THE INVENTION

An object of the present invention is to provide a method that allows an insulation support with an adhesive layer to be produced without air inclusions in a simple manner.

This object is achieved according to the invention by a method of the type described above wherein an adhesive film to be used to form the adhesive layer has a number of openings distributed over its surface to allow the passage of air, and is applied to the insulation support.

According to the invention the adhesive layer is achieved, not as previously using a liquid adhesive, but by using an adhesive film. The film is applied to the insulation support, there being several possibilities for this, which will be examined in more detail below. This adhesive film is preferably a film of a thermoplastic material, which becomes soft and sticky above a softening temperature and above this temperature produces a flat, reliable connection to the coil conductors, and which solidifies again on cooling. It can therefore be changed in a reversible manner between a soft, sticky and adhesive state and a solid state. It is completely solvent-free and can thus be processed over a long period without a defined time window. The thermoplastic polymer material used can be any thermoplastic polymer with a polyolefin, polyether, polyester, polyamide or polyurethane base. There is a very wide range of commercially available materials, all having different characteristics in respect of processing temperature, adhesive strength, shear strength and temperature resistance, so that it is possible to set the corresponding processing characteristics—tailored to the purpose—in a specific manner, depending on the polymer used.

It is particularly preferable for the thermoplastic material that is used to be a thermoplastic elastomer (TPE), it being possible here to use thermoplastic elastomers with a polyetheramide, polyetherester, polyesterurethane, polyetherurethane base or copolyesters from the polymer structures mentioned above, with polyesterurethane-based TPE preferably being used. Thermoplastic elastomers to a degree represent a "hybrid class" between known thermoplastics and known elastomers. Up to softening temperature, they behave as elastomers but at higher temperatures they can be processed in a thermoplastic manner, in other words they can change between a softened and harder state in a reversible manner. The thermoplastic element can be present in crystalline or amorphous form and on cooling beings about a reversible physical cross-linking from the fused material. These thermoplastic elastomers ideally combine the use characteristics of conventional elastomers, e.g. rubber, and the processing characteristics of thermoplastics. This offers the considerable advantage when using such a thermoplastic elastomer, particularly for rolled or curved saddle coils, particularly with respect to the shear forces that occur in such coils. This is because, as already described, the plate-type insulation support with its flat planar form is connected to the coil conductors that are similarly in one plane. After cooling, when the TPE has solidified, the winding or shaping to the curved form always takes place. As a result, shear forces must of necessity occur between the insulating plate, the fixing layer and the conductors and these can be compensated by the TPE layer, so that local detachment of the conductors from the support plate does not occur.

In order now to ensure that no air inclusions occur between film and support when the adhesive film is applied to the plate-type insulation support, the adhesive film used advantageously has a number of openings distributed over its surface to allow the passage of air. The surface of a plate-type insulation support and also the adhesive film that completely covers it is $1 \text{ m}^2$ or more, depending on the size of the gradient coil to be produced. In other words, the connecting surface between insulation support and film is very large. In order to prevent air inclusion, the inventive openings are provided on the film, through which any included air can escape during the connecting process. There are as many as possible of such openings, which can be configured in the form of holes or slits, distributed over the surface, so that there is a very short distance between the location of the air inclusion and the adjacent opening(s), regardless of where any air inclusion occurs locally. The air can therefore reach such an opening and escape through it very quickly. It is therefore not included when the adhesive film is connected and respectively adhered to the insulation support, thereby advantageously preventing the formation of an air bubble.

In principle it is possible to use an adhesive film already having openings. A commercially slit or perforated adhesive film can be used. Alternatively it is also possible to use a commercially available plastic adhesive film, which is closed in its original state, in other words it is not perforated or slit, and only to produce the openings just before applying the adhesive film.

The above object also is achieved in accordance with the invention by a method for producing a plate-type insulation support provided with an adhesive layer, that includes the steps of providing an adhesive film forming the adhesive layer, and providing an insulation support with a number of openings disposed in a distributed manner over the surface that allow the passage of air therethrough, and applying the film to the insulation support. The insulation support can be provided with openings in the form of holes or slits, which allow the passage of air when the adhesive film is applied. The openings are preferably disposed at free points between the winding wires that have later to be connected, in other words at positions on the insulation support which do not have an insulating function. The openings thus are disposed as a function of the winding geometry. The passage of air allowed therethrough prevents any air inclusions and bubble formations. Even though, when using an insulation support provided with openings according to this variant of the invention, it is possible to use an adhesive film that is closed, it is of course also possible to use an adhesive film also having openings, preferably in the form of slits and holes, in which instance both the insulation support and film would be provided with corresponding openings for the passage of air. This ensures an optimum passage of air.

Even though it is generally sufficient only to apply an adhesive film to one side of the insulation support, it is in principle also possible to cover the insulation support on both sides with a perforated or slit support film, so that it is possible in principle to connect the insulation support to coil windings or other coil elements on both sides by an adhesive connection. If an insulation support having openings is used, at least one of the adhesive films, though preferably both, should also have openings.

According to a first refinement of the invention the adhesive film can be removed from a roll in a continuous method and fed to a connecting facility, together with the insulation support, which is to be coated. If the support is to be coated on both sides, naturally two separate rolls are provided, from which the film is removed and between which the insulation support is fed to the connecting facility together with the films. A continuous coating operation thus takes place, wherein the film is removed from a roll. Alternatively it is possible also to use the film in the form of single sheets, with one insulation support and one or, in the case of double-sided coating, two adhesive films being fed into a connecting facility and being connected to one another there in a discontinuous method. Here the film and insulation support are not moved in a quasi-continuous manner through a connecting facility, which in this instance is configured in the manner of a continuous cylinder or similar, but a support and film are fed into the connecting facility, which is configured as a press, and are connected to one another there in a discontinuous operating step. In principle it is of course also possible beforehand to cut the individual sheets to length from a roll of adhesive film, which was optionally perforated just beforehand.

It is expedient to heat the adhesive film and/or the insulation support before and/or during the connecting process, in other words to ensure that the adhesive film is heated to a temperature above softening temperature at least in the region of connection to the insulation support and is therefore in a sticky state. Alternatively it would also be possible to coat the film and/or the insulation support with a very thin application of adhesive in a coating facility connected upstream of the connecting facility, said application of adhesive only serving to connect the film to the insulation support. After the film to be applied has been perforated or slotted, even the smallest air inclusions in the applied liquid or viscous adhesive can escape without impediment through the film openings during the connecting process.

In addition to the method the invention also relates to a facility for producing a plate-type insulation support provided with an adhesive layer for a gradient coil of a magnetic resonance device, having a connecting facility for connecting the insulation support to an adhesive film forming the adhesive layer, with the adhesive film and/or the insulation support having a number of openings distributed over their surface, to allow the passage of air.

In an embodiment of the invention this facility has a device connected upstream of the connecting facility to produce the openings in the adhesive film by perforating or slitting the adhesive film, the device preferably having a rotating cylinder with tools serving to perforate or slit. This device, in particular in the form of the rotating cylinder, allows continuous perforation or slitting of the adhesive film, which is preferably removed from a roll of adhesive film and fed by way of the rotating cylinder. This perforating or slitting device can also be dispensed with, if a commercially perforated or slit adhesive film is used, which is removed from a corresponding roll of adhesive film supported in a holder.

The connecting facility itself is preferably a continuously operating rolling facility, to which the adhesive film can be fed in a continuous manner with the insulation support. An appropriate feed technology is used with this refinement of the invention to feed the adhesive film, which is preferably unrolled from the roll of adhesive film, and the insulation support automatically to the connecting facility and pass it through this, with film and individual insulation supports being fed one after the other and being connected to one another in a continuous operation. Alternatively, it is also possible to use a connecting facility that operates in a discontinuous manner in the form of a pressing facility, to which one insulation support and one or, in the case of double-sided coating, two single sheets of adhesive film have to be fed. Both are fed preferably automatically, although manually is also possible, into the pressing facility, which is then closed to connect the two. To allow the release of air, with this refinement the heading tool or pressing surface, which presses onto the adhesive film, has a structured top surface or a structured intermediate layer is applied, for example in the form of a mesh or similar, so that there is a small gap between the top surface of the film and the surface of the heading tool, allowing the release of air from the film and not sealing it completely with total coverage.

Although it is in principle possible to use commercially separated sheets of film, in an embodiment of the invention, even when a discontinuously operating pressing facility is used, a roll of adhesive film is used, from which the adhesive film is removed and fed to a cutting facility for the removal of individual sheets of film, the cutting facility being upstream of the connecting facility. The adhesive film, which can be commercially slit or perforated, or which is fed to the device for perforating or slitting before being fed to the cutting facility, is thus separated into individual sheets immediately before processing.

As described above, it is in principle possible also to cover the insulation support on both sides with adhesive film, it being possible in this instance to feed two adhesive films at the same time to the connecting facility and optionally also beforehand to the device for producing the openings, to cover the insulation support on both sides.

To ensure a good connection between insulation support and adhesive film, a heating arrangement is provided to heat the insulation support and/or the adhesive film, preferably at least while the two are being connected. The heating arrangement preferably is provided at the connecting facility or integrated in this. The heating arrangement can use radiant heaters, fan heaters or resistance heaters, which are disposed above and/or below a contact surface for the insulation support and/or the adhesive film. In the case of a rolling facility, which allows continuous passage, the rolling facility for example has two circumferentially flat conveyor belts, above and below which the pressing rollers are provided. It is then possible to provide corresponding heating means above and below these conveyor belts to allow heating over a substantial part of the length of the rolling facility. It would also be possible to be able to heat one or more cylinders of the rolling facility. In the case of a pressing facility, it is possible to heat the individual heading tools or pressing surfaces using appropriate heating means, it being possible here also for resistance heaters or similar to be used without further ado.

Alternatively or in addition to heating, it would also be possible to connect a coating facility upstream of the connecting facility to coat the adhesive film and/or the insulation support with a liquid or viscous adhesive, the adhesive only serving to connect the film to the insulation support.

DESCRIPTION OF THE PREFERRED EMBODIMENTS

Figure 1:
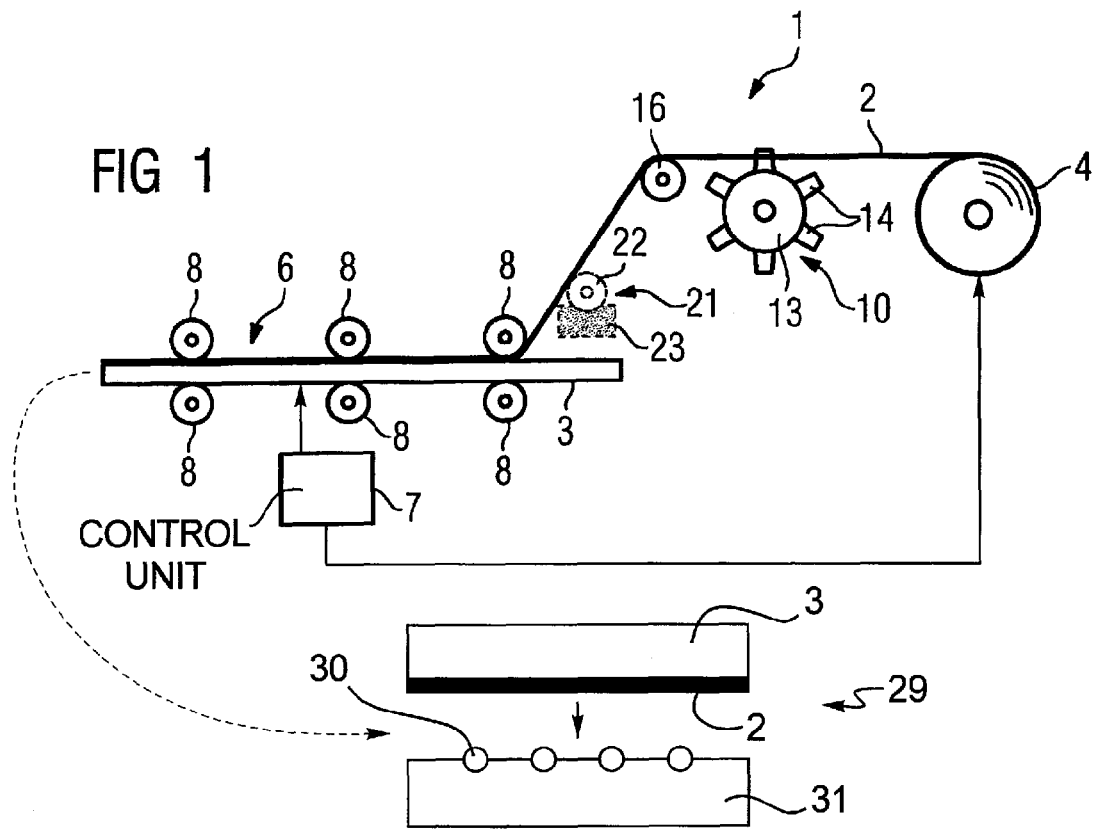
FIG. 1 shows a basic diagram of an inventive facility in a first embodiment.

FIG. 1 shows an inventive facility 1 for connecting an adhesive film 2 to an insulation support 3. The plastic adhesive film 2 is a thermoplastic elastomer, for example. The adhesive film 2 is wound in the form of a roll of adhesive film 4 in a continuous strip, the roll 4 itself being held in a corresponding holding system 5, in which it is supported in a rotatable manner. The adhesive film 2 can thus be removed from the plastic roll 4. The insulation support 3 is composed of a material with a high level of electrical insulation, for example a fiber-glass reinforced plastic material. The adhesive film 2 and the insulation support 3 are fed to a connecting facility 6, where both are connected firmly to one another. A control unit 7 controls all processes of the facility 1, including the process of conveying the adhesive film 2 and the conveying of the insulation support 3, which is fed in an appropriate feed technology (e.g. conveyor belt, etc.), which is not shown in more detail here. It would also be possible to feed the insulation support 3 manually into the connecting facility 6.

After leaving the connecting facility 6, the insulation support 3 with the adhesive film 2 attached thereto proceeds to a coil-adhering facility 29 at which the conductor 30 has been wound into an appropriate winding configuration in a winding form 31 is present. The conductor 30 in the winding form 31 is shown only schematically in FIG. 1; typically many more windings will be present. As discussed above, portions of the conductor 30 project above the top surface of the winding form 31, and thus are accessible for adherence to the adhesive film 2, which is either made tacky at the coil-adhering station 29, or prior to reaching the coil-adhering station 29. The insulation support 3 is positioned over the winding form 31 with the conductor 30 therein and after the conductor 30 is properly adhered to the adhesive film 2, the combination of the insulation support 3, the adhesive film 2 and the conductor 30 is separated from the winding form 29 and can then be bent into an appropriate shape, such as a cylinder.

Figure 2:
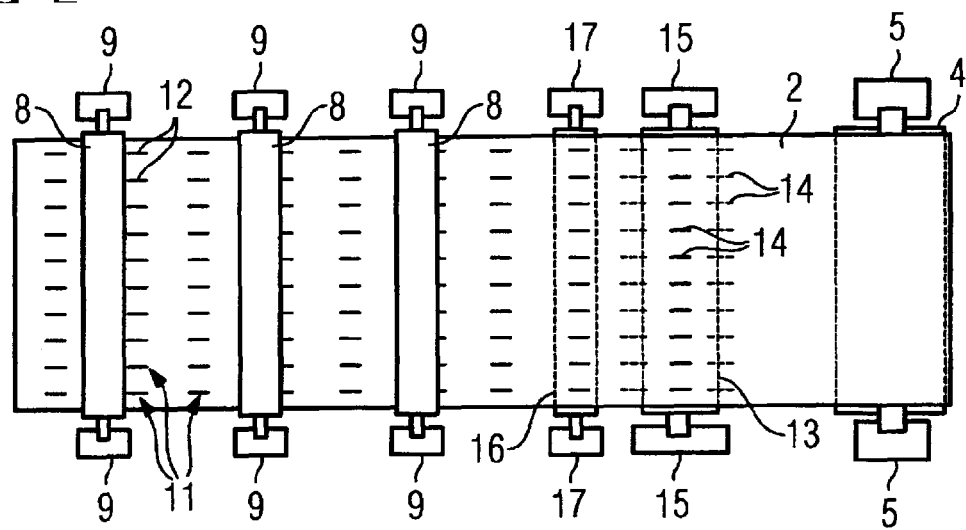
FIG. 2 shows a basic diagram of the facility of FIG. 1, viewed from above.

In the basic diagram according to FIGS. 1 and 2 the connecting facility 6 has six cylinders 8, and is thus configured as a rolling facility, in which the adhesive film 2 is rolled onto the insulation support 3 and connected to it. The cylinder drive unit is also controlled by way of the control facility 7. The cylinders 8 are of course held in corresponding cylinder frames 9, as shown in basic outline in FIG. 2.

Upstream of the connecting facility 6 is a device 10 for producing openings 11 in the adhesive film 2, incorporated here as slits 12. The device 10 has a cylinder 13, on the outside of which a number of individual knife-type tools 14 are distributed over its circumference and length to incorporate the slits 12. The cylinder 13 is also disposed in corresponding holders 15 in a rotatable manner and can be driven actively or can be rotated by the feed action of the adhesive film 2. The tools 14 are disposed in such a manner that, as the cylinder rotates, they cut into the adhesive film 2 and slit it, as shown in FIG. 2. In the example shown the adhesive film 2 runs from the device 10 by way of a guide roller 16, which is also held in corresponding rotating holders 17, to the connecting facility 6.

Figure 3:
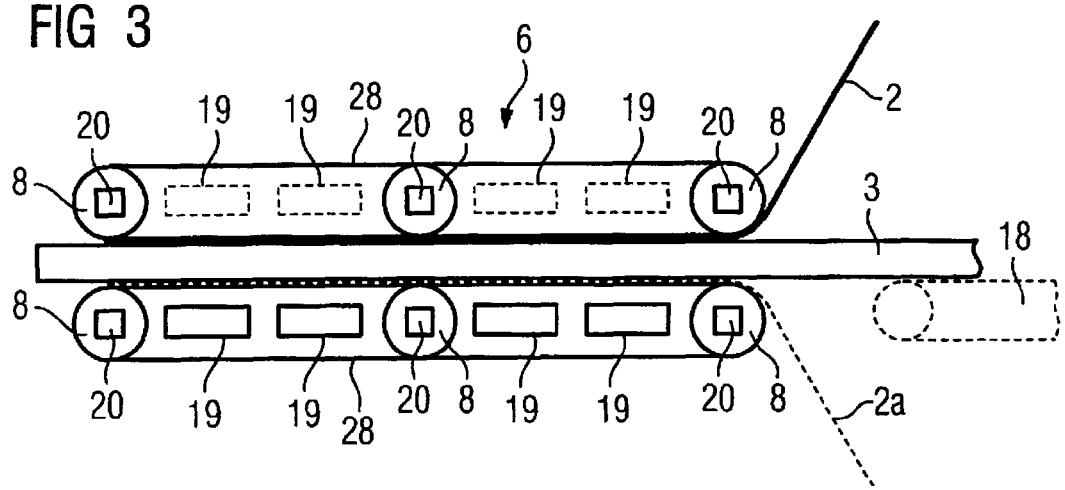
FIG. 3 shows a detailed basic diagram of the connecting facility of the facility of FIG. 1.

FIG. 3 shows a detailed basic diagram of the connecting facility 6. Specifically it shows three upper and three lower cylinders 8, around which a circulating transport belt 28 runs in each instance, circulating by means of the cylinders 8 driven actively by way of appropriate drive motors. In theory it is sufficient just to drive one upper and one lower cylinder but it is also possible to drive all the cylinders 8. In the example shown the adhesive film 2 is conveyed from above, to which end corresponding motors are activated for unrolling and conveying purposes, it being also possible to effect removal and respectively conveyance by the active driving of the cylinders 8, in other words by way of the connecting facility 6. The insulation support 3 is fed from the side, for example by way of a transport belt 18, also shown with a broken line here.

To connect the adhesive film 2 to the insulation support 3, heat is provided in the example shown, to which end various heating elements 19 are provided in the lower transport belt 28 in the embodiment shown and in the example shown corresponding heating elements 20 are also integrated in the cylinders 8. Thus the cylinders 8 are heated as well as the transport belt 17 or through this, as it may have corresponding openings, etc., the insulation support 3 and by way of this the plastic film 2. Heating takes place in such a manner that the softening temperature of the adhesive film 2 is exceeded at least in the region of its surface, which is connected to the insulation support 3, such that as a thermoplastic film it changes there into a sticky state and can be attached firmly to the insulation support 3 within the connecting facility 6 the connecting section or rolling section. It is of course possible, as shown with a broken line in FIG. 3, also to provide corresponding heating means 19 in the upper transport belt 28 and corresponding heating elements 20 in the upper cylinders 8, or even just in this region. In any case it must be ensured that there is sufficient heat input into the connecting region of the adhesive film 2 and the upper side of the insulation support 3. The cylinders 8 now press the softened, sticky adhesive film 2 onto the insulation support 3, so that they produce a firm connection. Any air included between the adhesive film 2 and the insulation support 3 during rolling can now escape without further ado by way of the openings 11 or slits 12, since there are short distances between the location of a possible air inclusion and the adjacent slit(s) 12. This ensures that the finally coated insulation support 3 has no air inclusions.

Alternatively or additionally FIG. 1 indicates the possibility of providing a coating facility 21 for applying a liquid or viscous adhesive, in the example shown to the lower side of the adhesive film 2, upstream of the connecting facility 6. In the example shown this coating facility 21 comprises a coating cylinder 22 and an adhesive tank 23. This adhesive serves only to connect the adhesive film 2 and the insulation support 3 to one another. It would of course also be possible to apply adhesive to the insulation support 3. However the connection between the adhesive film 2 and the insulation support 3 is preferably achieved thermally, as described with reference to FIG. 3.

FIG. 3 also shows the possibility of feeding in a second adhesive film 2a, as shown with a broken line. This is fed from the lower side, in such a manner that the insulation support 3 would be coated with an adhesive film on both sides here. In this instance the adhesive film 2a would also be assigned a corresponding device 10 for perforating or slitting and it would also be removed from a corresponding roll.

Figure 4:
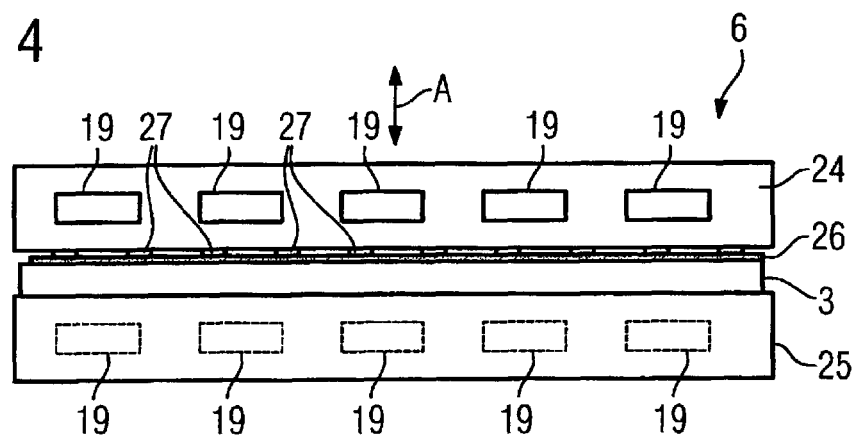
FIG. 4 shows a detailed basic diagram of a connecting facility in a second embodiment.

FIG. 4 shows a further variant of a connecting facility 6. This is configured as a pressing facility and has an upper pressing element 24 and a lower pressing element 25, it being possible to move the upper pressing element vertically, as shown by the double arrow A. This is a stationary press, which allows discontinuous operation. For loading purposes the upper press element 24 is first raised, after which an insulation support 3 and a sheet of adhesive film 26, which was cut beforehand to match the size of the insulation support 3, are inserted into the pressing facility (only shown here in outline). The upper press element 24 then moves downward and presses the sheet of adhesive film 26 with the insulation support 3. In this instance as well the connection is preferably thermally induced, to which end corresponding heating elements 19 are provided in the upper press element. These can also be provided in the lower press element 25, as shown with a broken line. The sheet of adhesive film 26 is of course also slit. It can either be commercially available in sheet form or can be removed from a roll of adhesive film 4, as shown in FIG. 1, and be slit, for example, by a facility 10 connected upstream. In this instance however a cutting facility would be connected downstream of the device 10, to separate individual sheets from the infinite strip of adhesive film.

To allow the passage of air through the slots 12 in the sheet of adhesive film 26 in the event of any air inclusion, the lower side of the upper press element 24 is structured; in the example shown there are corresponding elevations 27, but these are only by way of example. It would also be possible to insert a structured, mesh-type mat therebetween, etc. The aim is to prevent flat contact between the upper press element 24 and the adhesive film causing the slits 12 to be completely covered, thereby impeding the release of air.

It would similarly be possible, in respect of all the embodiments described, also to use an insulation support 3, which also has corresponding openings, the position of the openings being selected as a function of the winding geometry to be received at a later stage. This pierced insulation support can be covered with a similarly slit adhesive film. It would however also be possible to use a closed adhesive film in this instance, since the air can pass through the support openings. In this instance the device 10 for producing the openings 11 in the adhesive film 2 would not be essential, if a closed adhesive film is used. If however an insulation support having openings is covered with adhesive film on both sides, at least one of the adhesive films must have corresponding openings. In this instance the closed film is first applied to the insulation support and then the film provided with openings. The insulation support itself can be provided with openings during production; such openings therefore do not have to be produced immediately before connection with the adhesive film.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for producing a gradient coil arrangement for a magnetic resonance apparatus, comprising the steps of;
   providing an adhesive film and an insulating support with each of said adhesive film and said insulating support having a plurality of openings distributed therein allowing passage of air through said openings;
   bringing said adhesive film and said insulating support into contact with each other and pressing said adhesive film to said insulating support to form an adhesive layer on said insulating support while allowing air between said adhesive film and said insulating support to escape through at least some of said openings in said adhesive film and at least some of said openings in said insulating support during at least a portion of said pressing; and
   adhering a wound gradient coil conductor to said adhesive layer on said insulating support to produce a gradient coil arrangement comprised of said conductor, said adhesive layer and said insulating support.

2. A method as claimed in claim 1 comprising providing each of said adhesive film and said insulation support with openings therein selected from the group consisting of holes and slits.

3. A method as claimed in claim 1 comprising providing said adhesive film with openings therein by providing said adhesive film as a prefabricated film with said openings therein.

4. A method as claimed in claim 1 comprising providing said adhesive film with openings therein by providing said adhesive film as a non-perforated film and producing said openings therein immediately before bringing said adhesive layer into contact with said insulation support.

5. A method as claimed in claim 1 wherein said adhesive layer is a first adhesive layer and wherein the step of bringing said adhesive layer into contact with said insulation support comprises bringing said first adhesive layer into contact with a first side of said insulation support to provide a first adhesive layer at said first side of said insulation support, and comprising the additional steps of providing a second adhesive layer, said second adhesive layer having openings therein allowing passage of air therethrough, and bringing said second adhesive film into contact with a second side of said insulation support, opposite said first side, to form a second adhesive layer at said second side of said insulation support, by pressing said second adhesive film onto at least a portion of said second side of said insulation support while allowing air to escape through at least some of said openings in said second adhesive film.

6. A method as claimed in claim 1 wherein the step of bringing said adhesive film into contact with said insulating support comprises unrolling said adhesive film continuously from a roll of said adhesive film and continuously feeding said adhesive film onto said insulation support.

7. A method as claimed in claim 1 wherein the step of bringing said adhesive film into contact with said insulation support comprises placing a discrete sheet of said adhesive film onto said insulation support.

8. A method as claimed in claim 1 comprising heating at least one of said adhesive film and said insulation support at a time selected from the group consisting of before bringing said adhesive film into contact with said insulation support and while bringing said adhesive film into contact with said insulation support.

9. A method as claimed in claim 1 comprising forming said adhesive film by coating a non-adhesive film with an adhesive prior to bringing said adhesive film into contact with said insulation support.

10. A method as claimed in claim 1 comprising coating said insulation support with adhesive prior to bringing said adhesive film into contact with said insulation support.

11. An apparatus for producing a gradient coil arrangement for a magnetic resonance apparatus, comprising:
a connecting device provided with an adhesive film and an insulating support with each of said adhesive film and said insulating support having a plurality of openings distributed therein allowing passage of air through said openings;
said connecting device bringing said adhesive film and said insulating support into contact with each other and pressing said adhesive film to said insulating support to form an adhesive layer on said insulating support while allowing air between said adhesive film and said insulating support to escape through at least some of said openings in said adhesive film and at least some of said openings in said insulating support during at least a portion of said pressing; and
a coil-adhering device that adheres a wound gradient coil conductor to said adhesive layer on said insulating support to produce a gradient coil arrangement comprised of said conductor, said adhesive layer and said insulating support.

12. An apparatus as claimed in claim 11 wherein said connecting device is provided with each of said adhesive film and said insulation support with openings therein selected from the group consisting of holes and slits.

13. An apparatus as claimed in claim 11 wherein said connecting device is provided with said adhesive film as a prefabricated film with said openings therein.

14. An apparatus as claimed in claim 11 wherein said connecting device is provided with said adhesive film as a non-perforated film and comprises a perforator that produces said openings therein immediately before bringing said adhesive layer into contact with said insulation support.

15. An apparatus as claimed in claim 11 wherein said adhesive layer is a first adhesive layer and wherein said connecting device brings said adhesive layer into contact with said insulation support by bringing said first adhesive layer into contact with a first side of said insulation support to provide a first adhesive layer at said first side of said insulation support, and wherein said connecting device is provided with a second adhesive layer, said second adhesive layer having openings therein allowing passage of air therethrough, and brings said second adhesive film into contact with a second side of said insulation support, opposite said first side, to form a second adhesive layer at said second side of said insulation support, by pressing said second adhesive film onto at least a portion of said second side of said insulation support while allowing air to escape through at least some of said openings in said second adhesive film.

16. An apparatus as claimed in claim 11 comprising a roll of said adhesive film and continuously feeding said adhesive film from which said adhesive film is continuously unrolled and fed to said connecting device.

17. An apparatus as claimed in claim 11 wherein said connecting device is provided with a discrete sheet of said adhesive film to bring into contact with said insulation support.

18. An apparatus as claimed in claim 11 wherein said connecting device comprises a heating arrangement that heats at least one of said adhesive film and said insulation support at a time selected from the group consisting of before bringing said adhesive film into contact with said insulation support and while bringing said adhesive film into contact with said insulation support.

19. An apparatus as claimed in claim 11 comprising a coater that forms said adhesive film by coating a non-adhesive film with an adhesive prior to providing said adhesive film to said connecting device.

20. An apparatus as claimed in claim 11 wherein said connecting device coats said insulation support with adhesive prior to bringing said adhesive film into contact with said insulation support.

* * * * *